United States Patent
Schneider

(10) Patent No.: US 7,688,233 B2
(45) Date of Patent: Mar. 30, 2010

(54) COMPRESSION FOR DEFLATE ALGORITHM

(75) Inventor: James Paul Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 45 days.

(21) Appl. No.: 12/069,207

(22) Filed: Feb. 7, 2008

(65) Prior Publication Data

US 2009/0201180 A1 Aug. 13, 2009

(51) Int. Cl.
*H03M 7/34* (2006.01)

(52) U.S. Cl. .............................. 341/51; 341/64; 341/59; 341/65; 341/67; 341/107

(58) Field of Classification Search .................. 341/50, 341/51, 59, 64, 65, 67, 107
See application file for complete search history.

(56) References Cited

U.S. PATENT DOCUMENTS

| | | | |
|---|---|---|---|
| 5,951,623 A * | 9/1999 | Reynar et al. ............... 708/203 |
| 6,535,642 B1 * | 3/2003 | De Bonet ..................... 382/232 |
| 6,683,547 B2 * | 1/2004 | Border et al. ............... 341/106 |
| 6,686,857 B2 * | 2/2004 | LoCasale et al. ............ 341/110 |
| 6,985,965 B2 * | 1/2006 | Hannu et al. ................. 709/247 |
| 7,039,394 B2 * | 5/2006 | Bhaskaran ............... 455/414.1 |
| 7,064,688 B2 * | 6/2006 | Collins et al. ................. 341/87 |
| 7,155,173 B2 * | 12/2006 | Leung et al. ................. 455/72 |
| 7,283,591 B2 * | 10/2007 | Ruehle ...................... 375/253 |
| 7,358,874 B2 * | 4/2008 | Archbold et al. ............ 341/106 |
| 7,365,658 B2 * | 4/2008 | Todorov et al. ............... 341/63 |
| 2003/0031246 A1 * | 2/2003 | Heath ........................ 375/240 |
| 2005/0047669 A1 * | 3/2005 | Smeets et al. ............... 382/243 |
| 2009/0002207 A1 * | 1/2009 | Harada et al. ................. 341/51 |

* cited by examiner

*Primary Examiner*—Linh V Nguyen
(74) *Attorney, Agent, or Firm*—Blakely, Sokoloff, Taylor & Zafman LLP

(57) ABSTRACT

A method and apparatus for compressing data is described. In one embodiment, a processor receives one or more strings of data to be compressed. Duplicate strings are replaced with pointers using a first compression algorithm. An output of the first compression algorithm is processed with a second compression algorithm using a variable context dynamic encoder to generate a tree of non-overlapping bit-sequences where the length of each sequence is being inversely proportional of the likelihood of that symbol needing to be encoded. Unused symbols are not generated on the tree.

20 Claims, 17 Drawing Sheets

US 7,688,233 B2

COMPRESSION FOR DEFLATE ALGORITHM

TECHNICAL FIELD

Embodiments of the present invention relate to data compression, and more particularly, to improving the compression ratio of deflate compression algorithm.

BACKGROUND

Data compression or source coding is the process of encoding information using fewer bits than an unencoded representation would use through use of specific encoding schemes. As with any communication, compressed data communication only works when both the sender and receiver of the information understand the encoding scheme.

One data compression algorithmic, known as deflate algorithm, is based on two compression algorithms: LZSS or LZ77, and Huffman coding. LZSS achieves compression by replacing common strings with pointers to previously seen occurrences of the string. Huffman coding replaces common byte values with shorter bit sequences and uncommon byte values with longer sequences.

During compression, the compressor can encode a particular block in two different ways: First, it can used a fixed Huffman coding tree, which is defined in the RFC that defines the deflate algorithm. Second, the compressor can examine the block being compressed and generate an optimal Huffman coding tree, and transmit the tree definition along with the compressed block.

However, there are trade-offs with either coding scheme. In the first case, the default fixed coding tree may not accurately represent the probabilities actually encountered, which means the compression ratio could be lower than it would be with a more accurate tree (in this context, the compression ratio is the number of bytes shorter than the original data stream for the compressed stream, divided by the original length of the data stream, expressed as a percentage; for example, a file that starts out as 1000 bytes and gets compressed to 720 bytes has a compression ratio of 28%). In the second case, the space required to send the tree definition reduces the compression ratio. In both cases, the Huffman coding tree being used is static, and only expresses the global statistics of the entire block being compressed.

BRIEF DESCRIPTION OF THE DRAWINGS

The present invention is illustrated by way of example, and not by way of limitation, in the figures of the accompanying drawings and in which.

DETAILED DESCRIPTION

Described herein is a method and apparatus for compressing data is described. In one embodiment, a processor receives one or more strings of data to be compressed. Duplicate strings are replaced with pointers using a first compression algorithm. An output of the first compression algorithm is processed with a second compression algorithm using a variable context dynamic encoder to generate a tree of non-overlapping bit-sequences where the length of each sequence is being inversely proportional of the likelihood of that symbol needing to be encoded. Unused symbols are not generated on the tree. In one embodiment, the variable context dynamic encoder includes an encoder where the statistics for the literals do not needed to be transmitted to a decoder.

Figure 1:
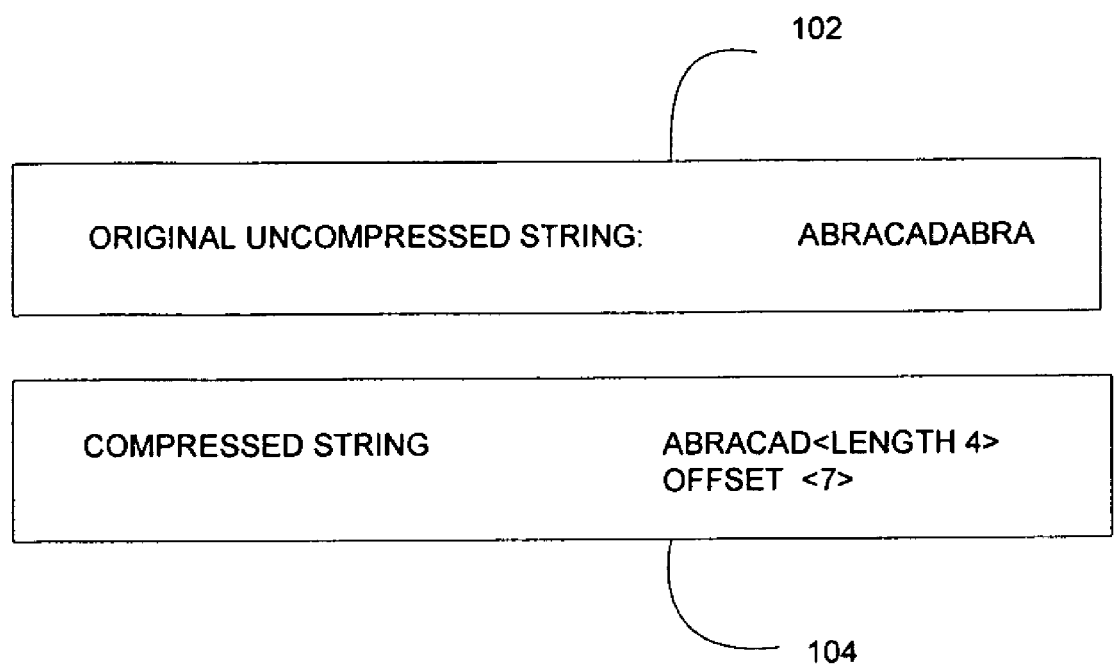
FIG. 1 is a block diagram illustrating an example of a LZSS algorithmic.

FIG. 1 is a block diagram illustrating an example of a LZSS algorithm. The following explanation tracks the compression of an input string "abracadabra" 102 processed by the LZSS algorithm where a string is replaced by a reference to where it was seen earlier. For example, in "abracadabra", the second instance of "abra" can be replaced with the offset (7) and length (4) of the preceding string. Deflate algorithm codes lengths and literals together while handling offsets separately. So, the literals portion of the compressed string 104 would be "abracad<length 4>" and the offsets portion would be <7>.

Figure 2A:
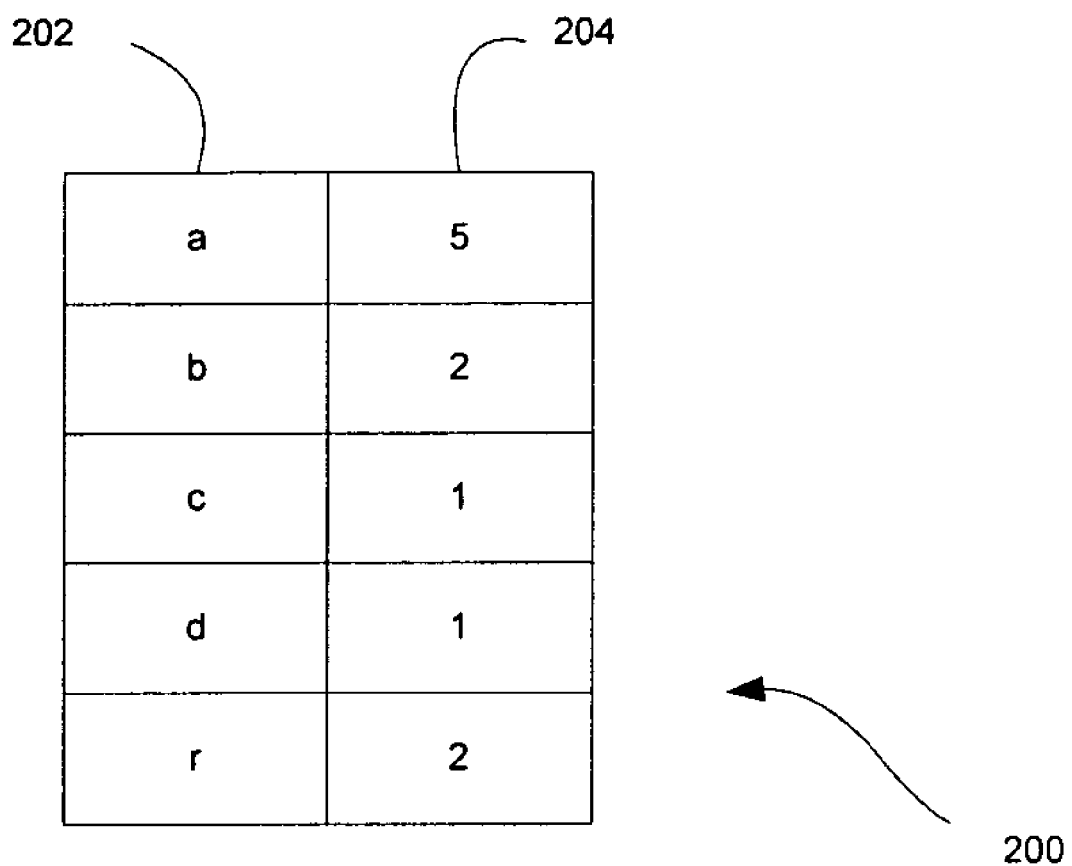
FIG. 2 is a block diagram illustrating an example of a tree generated from a Huffman coding algorithm.
Figure 2B:
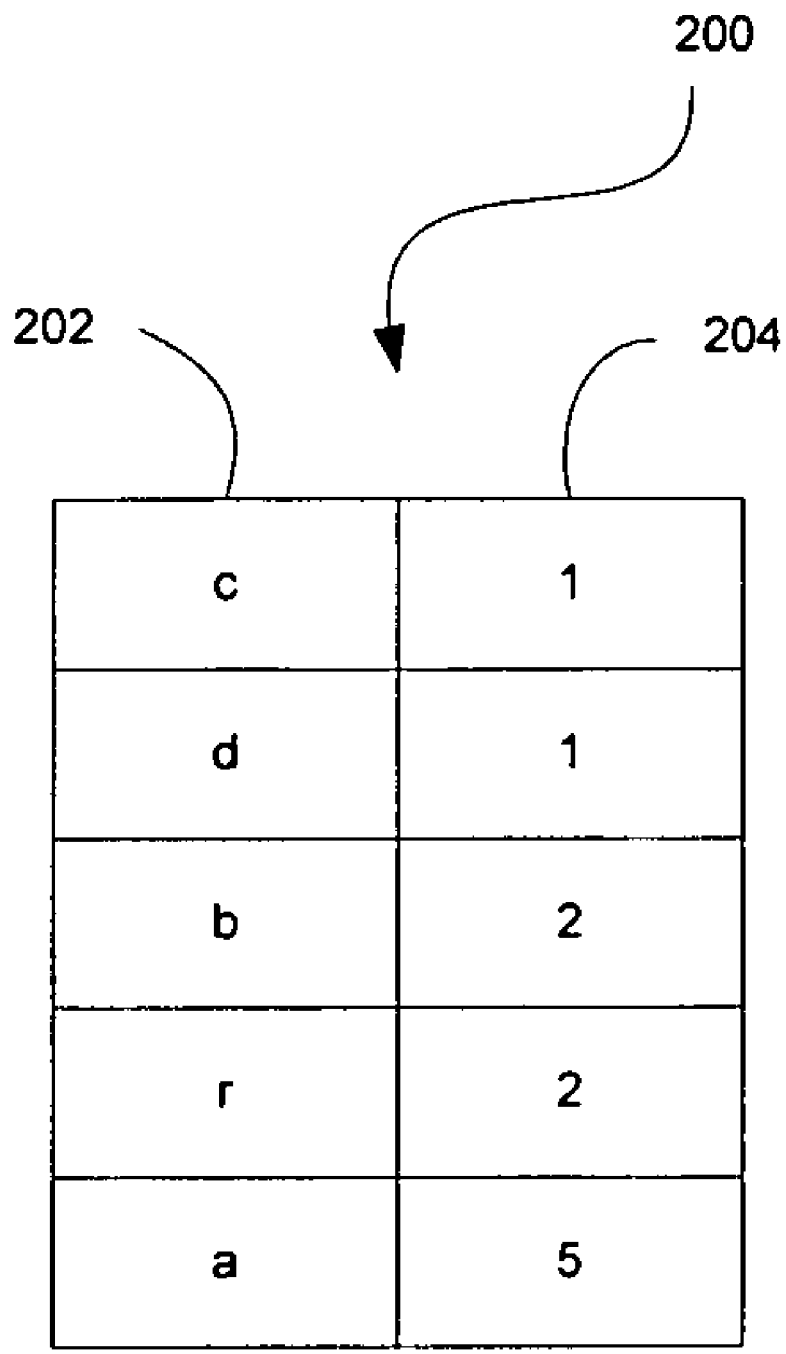
Figure 2C:
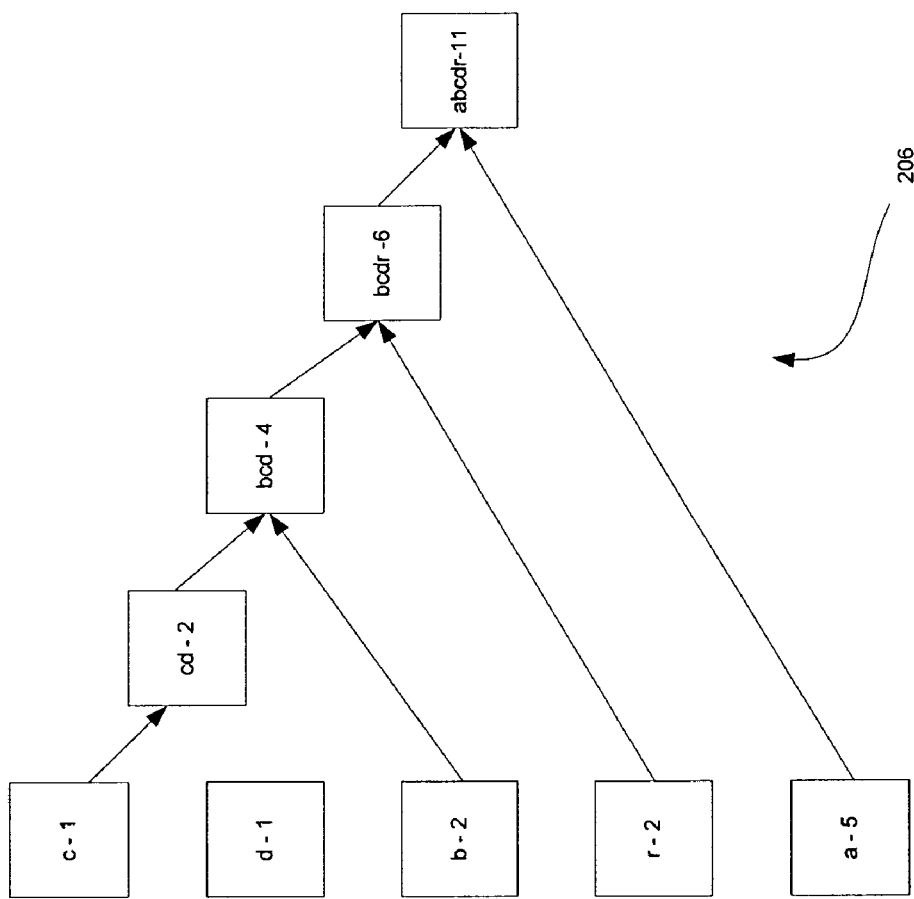

FIGS. 2A-2C are diagrams illustrating an example of a Huffman coding algorithm using a static table 200. With respect to FIG. 2A, going back to the original input string of "abracadabra", the number of occurrence 204 of each individual letter 202 is counted (e.g., "a" has five occurrences, "b" has two occurrences, "c" has one occurrence, "d" has one occurrence, "r" has two occurrences). To construct static table 200, the counts of occurrences are reordered by numerical order, then by literal code order (e.g. alphabetical in the present example). FIG. 2B illustrates static table 200 reordered by numerical order, then by literal code order.

The two nodes with the lowest counts are iteratively replaced with a new node that combines the counts, stopping when one node is left. FIG. 2C illustrates a tree 206 resulting from that process. Assigning a bit value of 1 to the upper branch and a bit value of 0 to the lower branch, the following codes is obtained:

c-1111; d-1110; b-110; r-10; a-0

Thus, the original input string of "abracadabra" would be coded as 0-110-10-0-1111-0-1110-0-110-10-0. However, this coding does not include data the decoder would need to recreate the tree. The construction used by the deflate algorithm would actually switch the code values for "c" and "d". Representing the data to recreate the Huffman tree using the deflate format specification would take just over 12 bytes (101 bits, to be exact, not including a fixed block overhead of an additional 14 bits).

Figure 3A:
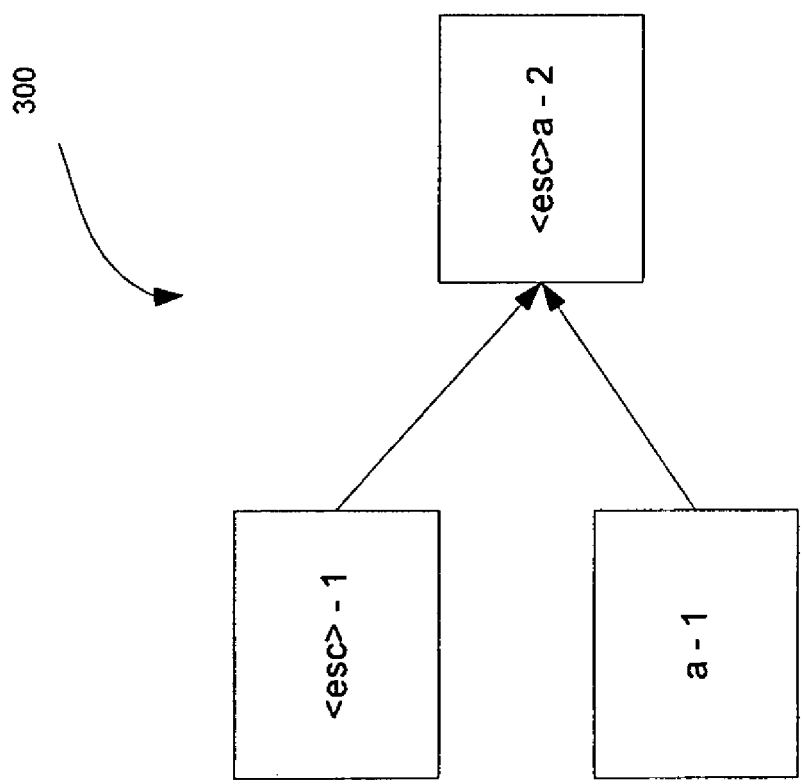
FIGS. 3A-3J are block diagrams of one embodiment of a tree generated from an adaptive context Huffman coding algorithm.

FIGS. 3A-3J are diagrams illustrating one embodiment of an adaptive context Huffman coding algorithm 300 where the tree used for coding evolves over time. We start with an empty model (that can only code an "escape"—in this case, it tells the decoder to expect a literal value):

FIG. 3A illustrates a tree 300 generated when the coder sees "a" from an input string of "abracadabra". The coder emits the escape and the literal "a". Since there's nothing in the model at this point except for the escape, the only thing the coder really emits is the literal "a" (the escape can be inferred). The tree illustrated in FIG. 3A is based on the assumption that escape count stays fixed at 1, and that escape sorts before all letters.

Figure 3B:
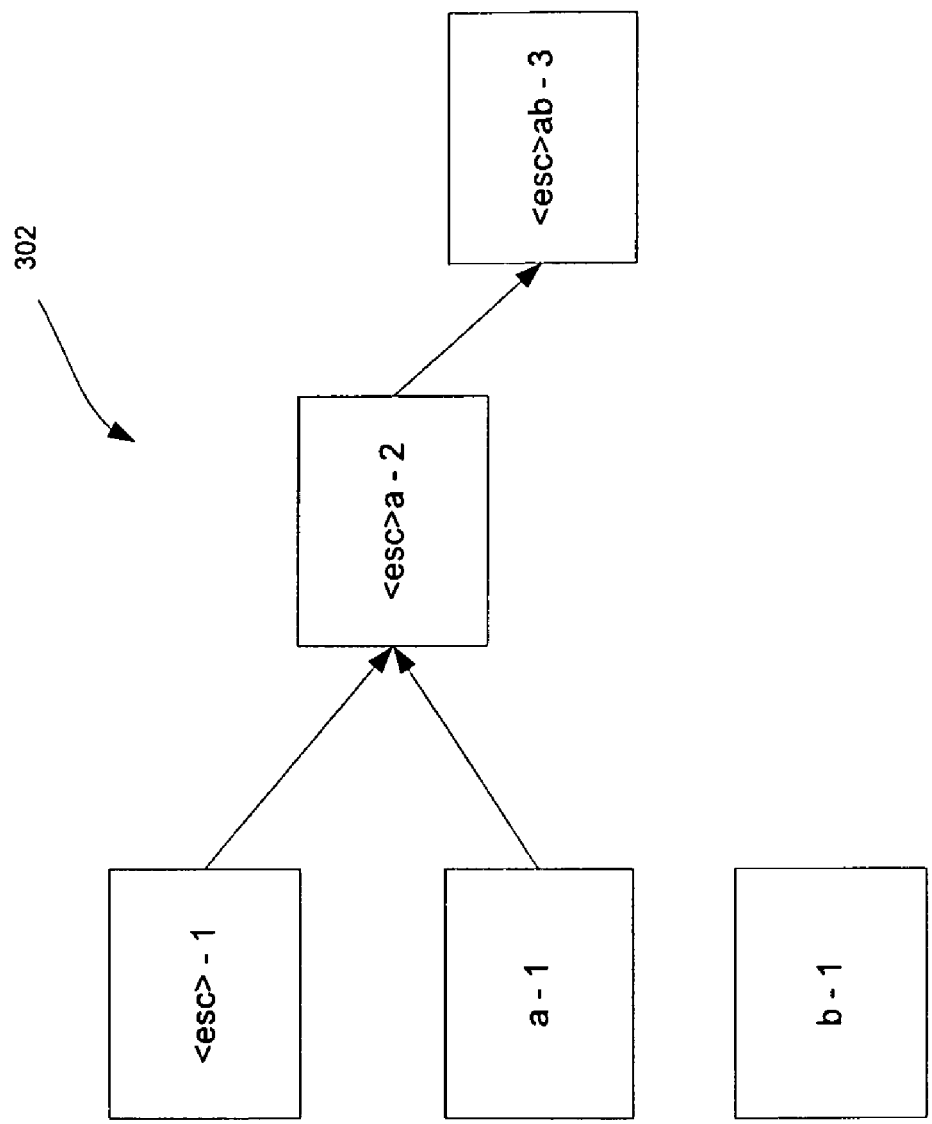

FIG. 3B illustrates a tree 302 generated when the coder sees "b". The coder emits the escape (a single "1" bit) and the literal "b". The code stream is now "a"-1-"b".

Figure 3C:
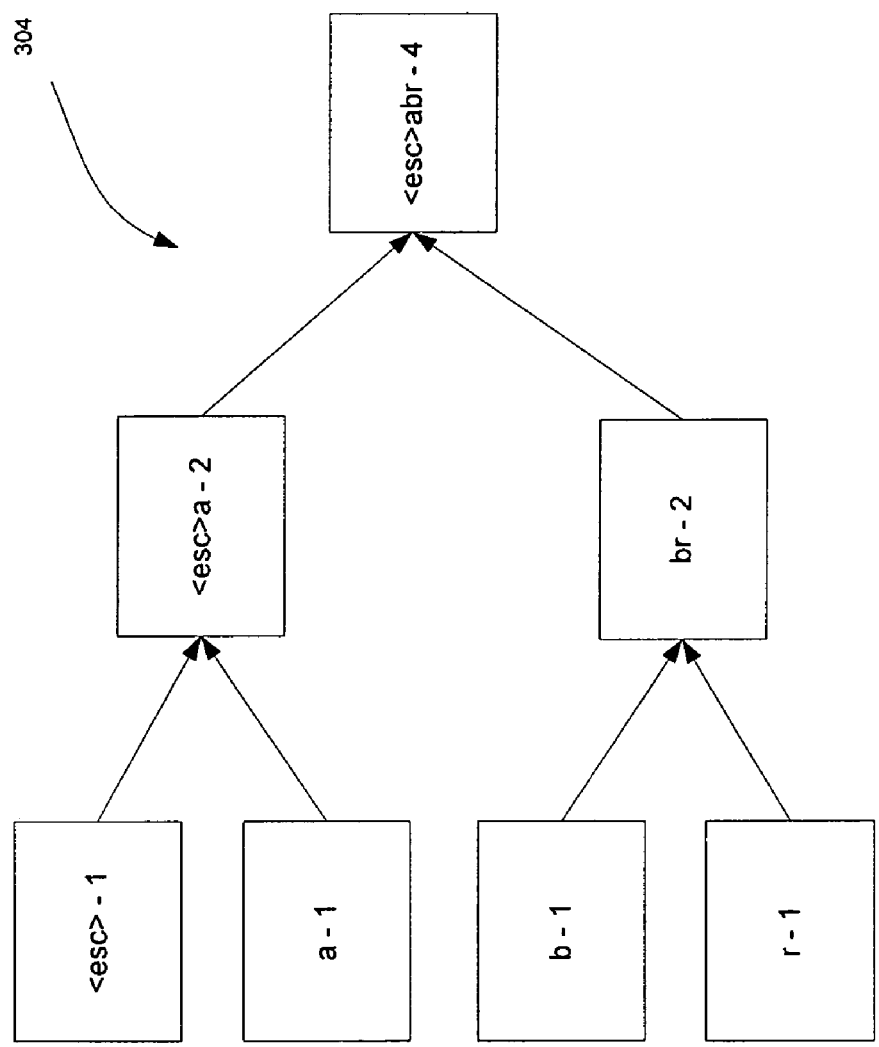

FIG. 3C illustrates a tree 304 generated when the coder sees "r". The coder emits the escape (now "11") and the literal "r". The output is now: "a"-1-"b"-11-"r".

Figure 3D:
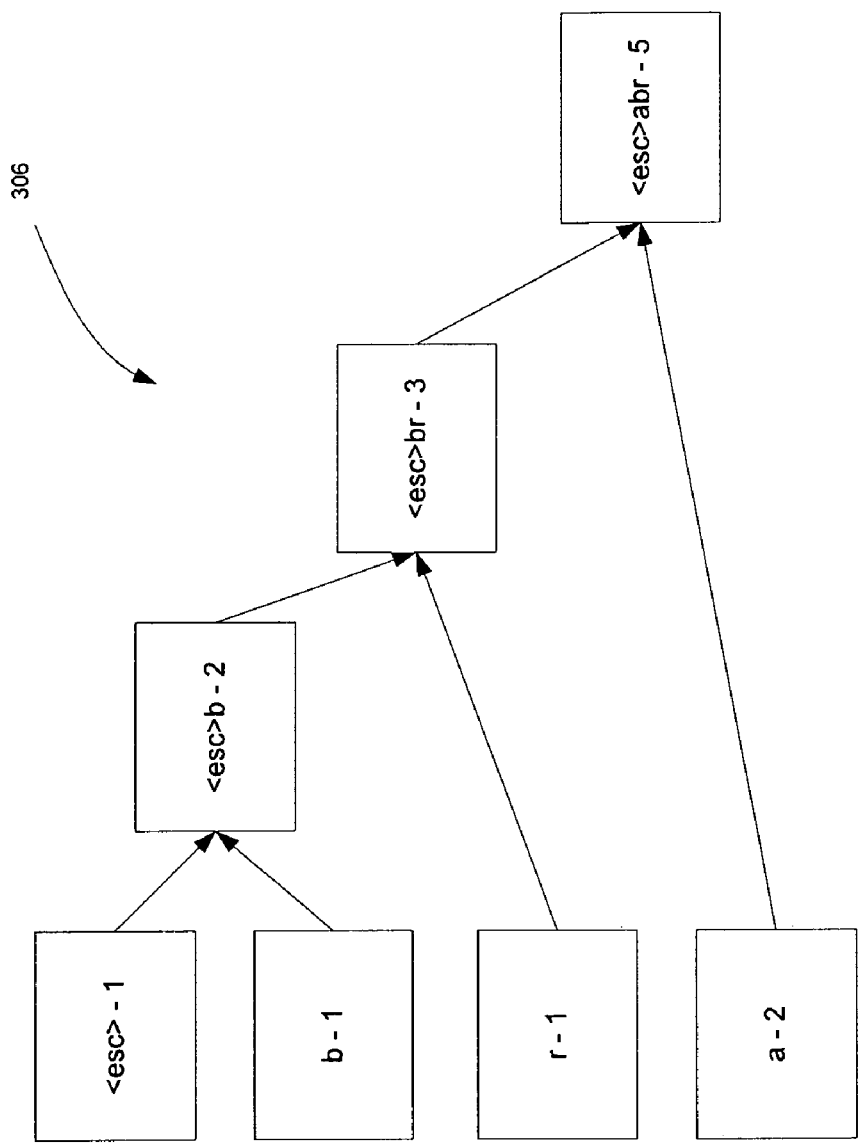

FIG. 3D illustrates a tree 306 generated when the coder sees "a". The coder emits a code for "a". The output is now: "a"-1-"b"-11-"r"-10.

Figure 3E:
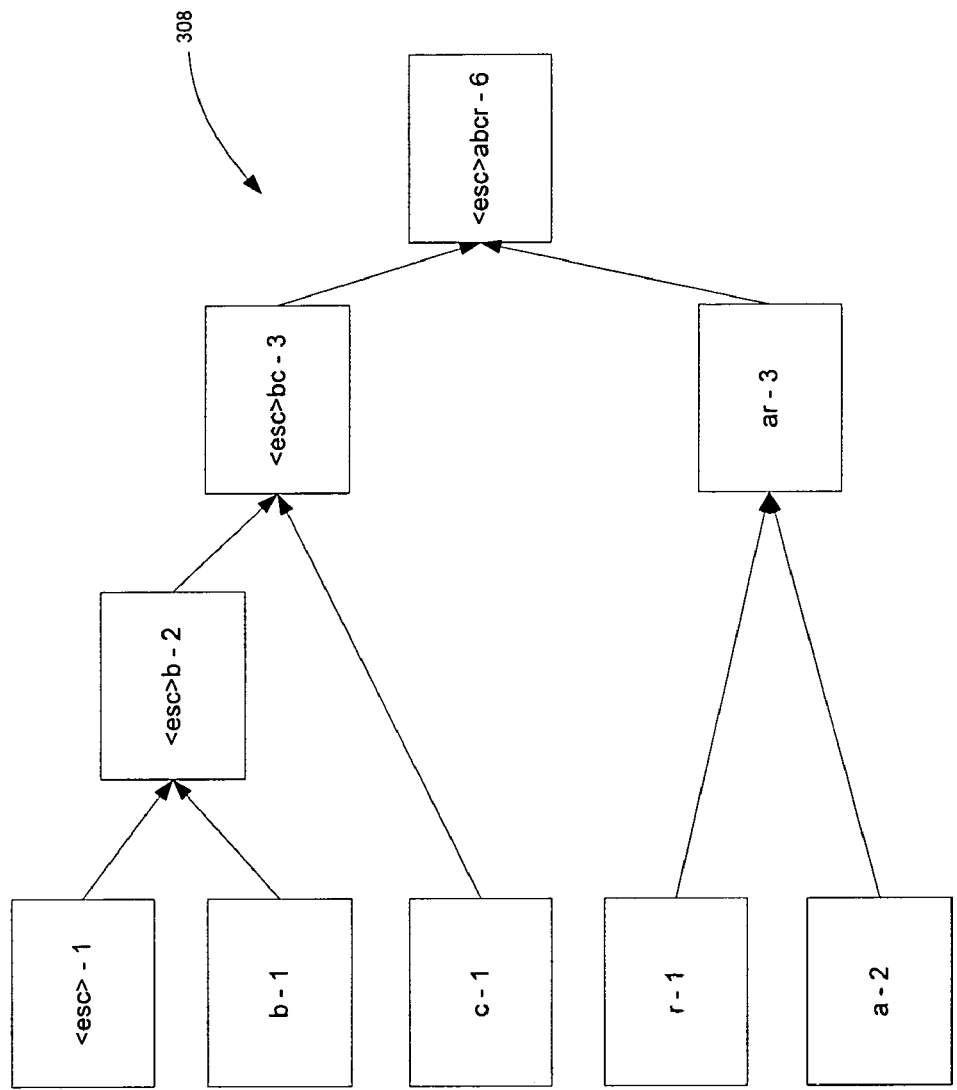

FIG. 3E illustrates a tree 308 generated when the coder sees "c". The coder emits the escape and a literal "c". The output is now "a"-1-"b"-11-"r"-10-111-"c".

Figure 3F:
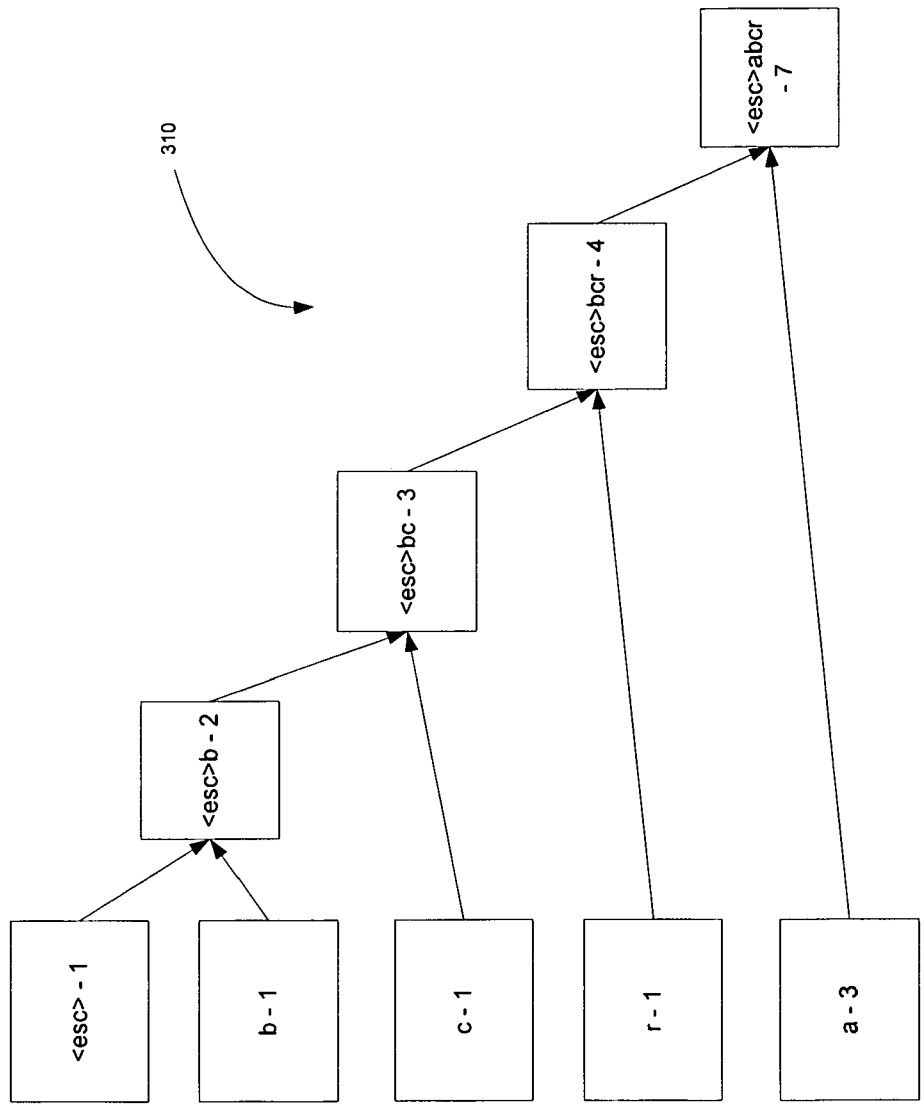

FIG. 3F illustrates a tree 310 generated when the coder sees "a". The coder emits the code for "a" (00). The output is now "a"-1-"b"-11-"r"-10-111-"c"-00.

Figure 3G:
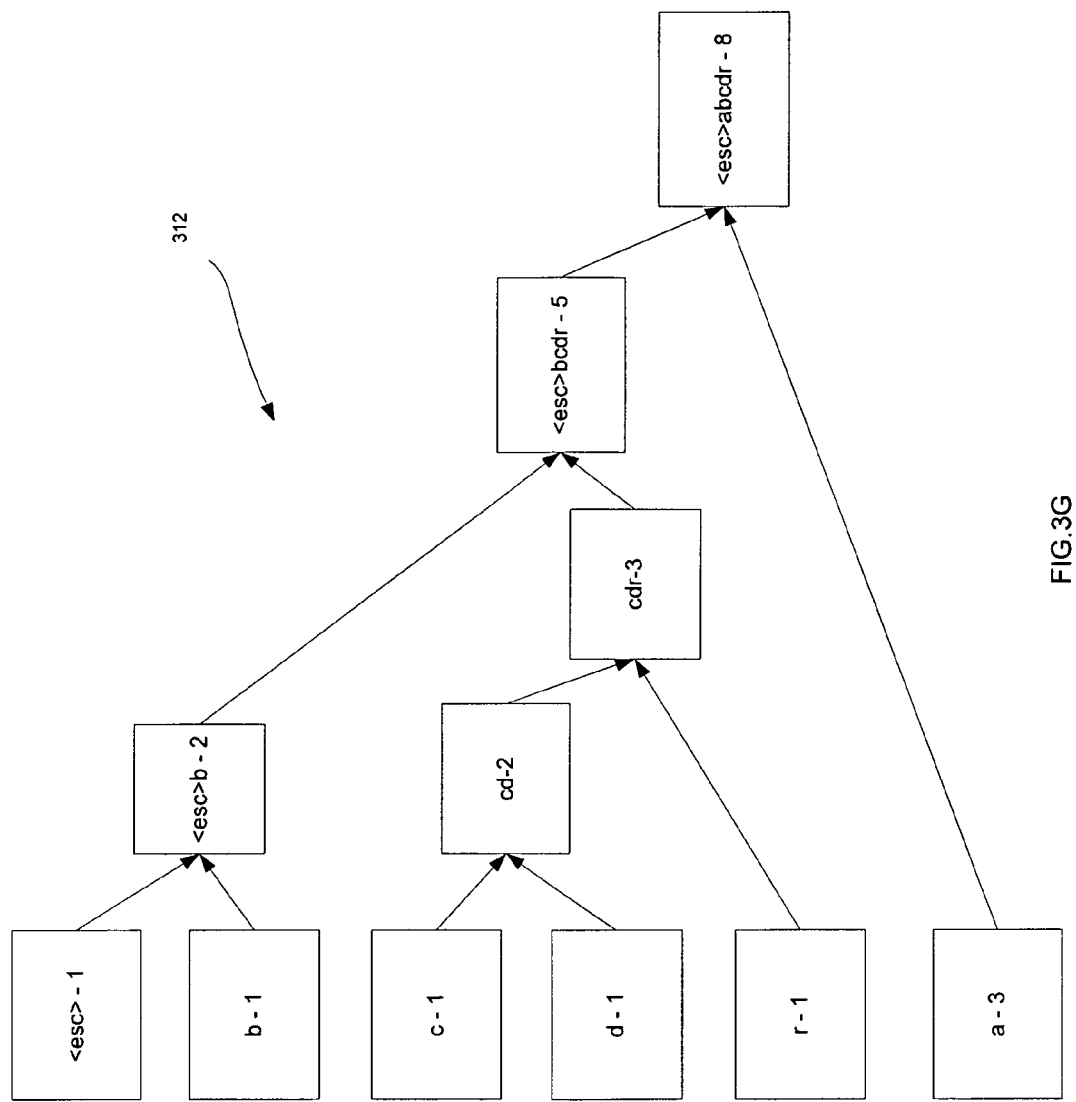

FIG. 3G illustrates a tree 312 generated when the coder sees "d". The coder emits the escape and code literal "d". The output is now "a"-1-"b"-11-"r"-10-111-"c"-00-1111-"d".

Figure 3H:
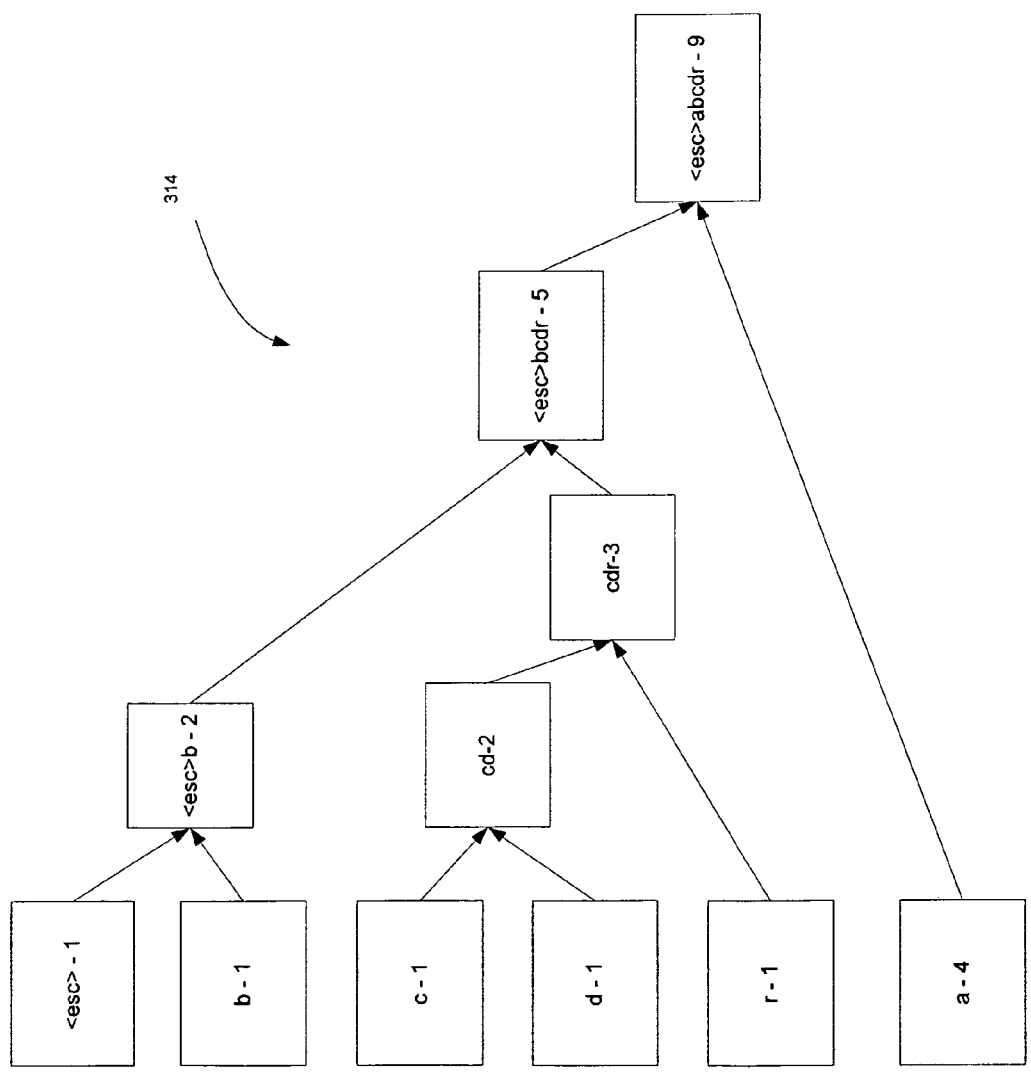

FIG. 3H illustrates a tree 314 generated when the coder sees "a". The coder emits the code for literal "a". The output is now "a"-1-"b"-11-"r"-10-111-"c"-00-1111-"d"-0.

Figure 3I:
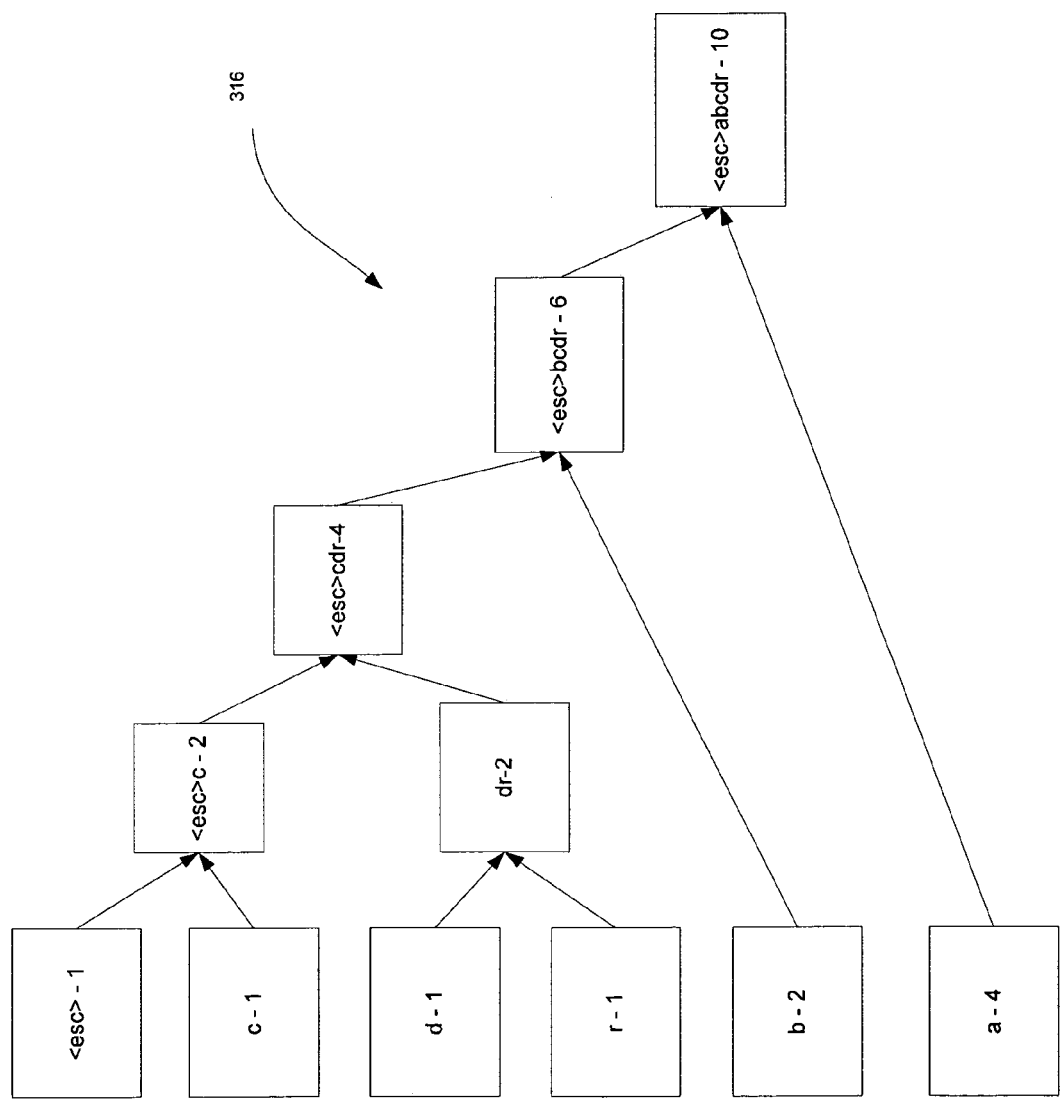

FIG. 3I illustrates a tree 316 generated when the coder sees "b". The coder emits the code for literal "b". The output is now "a"-1-"b"-11-"r"-10-111-"c"-00-1111-"d"-0-110.

Figure 3J:
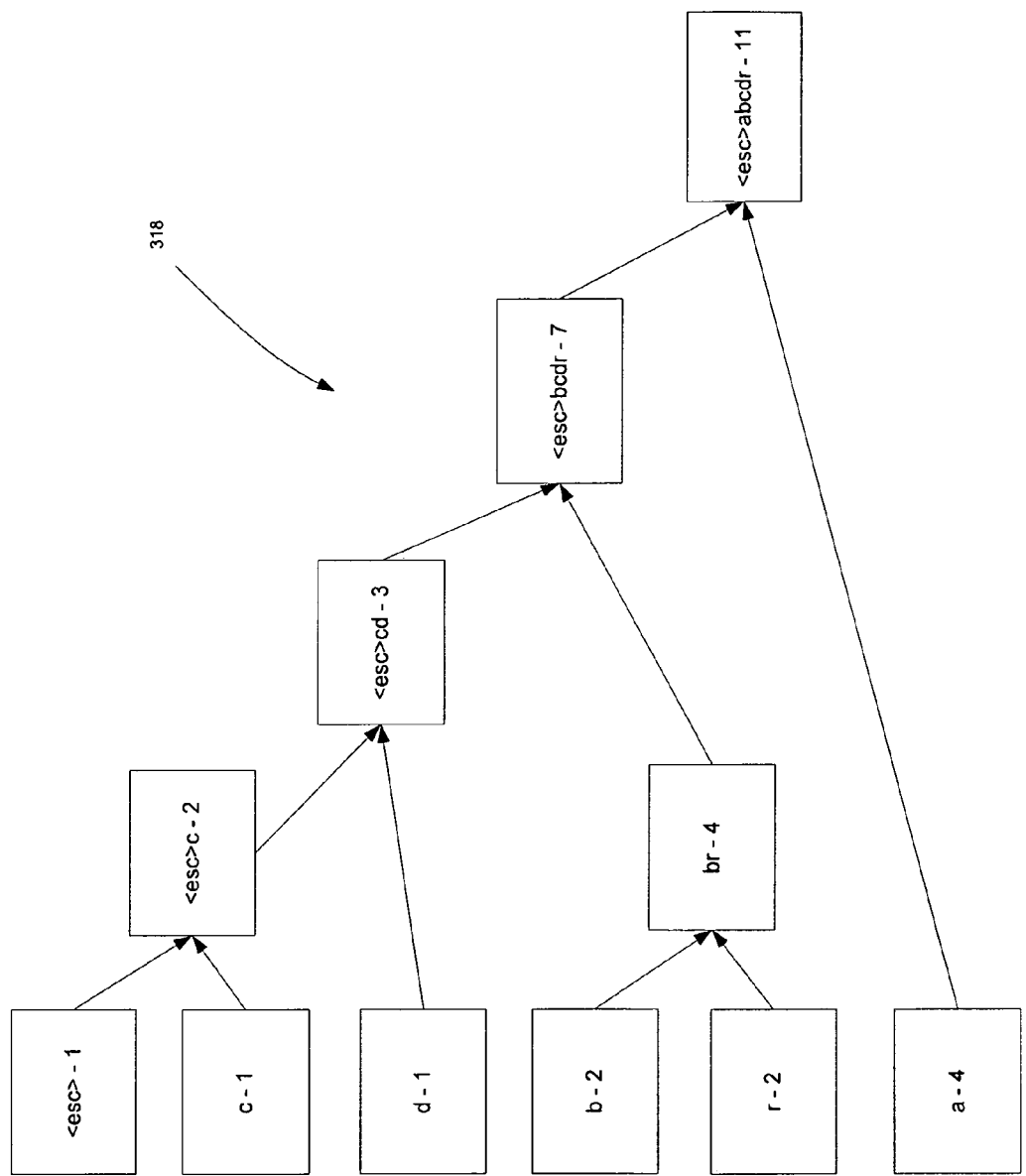

FIG. 3J illustrates a tree 318 generated when the coder sees "r". The coder emits the code for literal "r". The output is now "a"-1-"b"-11-"r"-10-111-"c"-00-1111-"d"-0-110-1100.

Finally, when the coder sees the last "a". The final output is "a"-1-"b"-11-"r"-10-111-"c"-00-1111-"d"-0-110-1100-0. Not including the literals, the coder produced 23 bits (the same number of bits as the static table). However, this coding is shorter than the static coding as illustrated above with respect to FIGS. 2A-2C, since there's no need to transmit the statistics for the literals to the decoder. The five literals would take at most 5 bytes to transfer, instead of the just over 12 for the explicit table.

Figure 4:
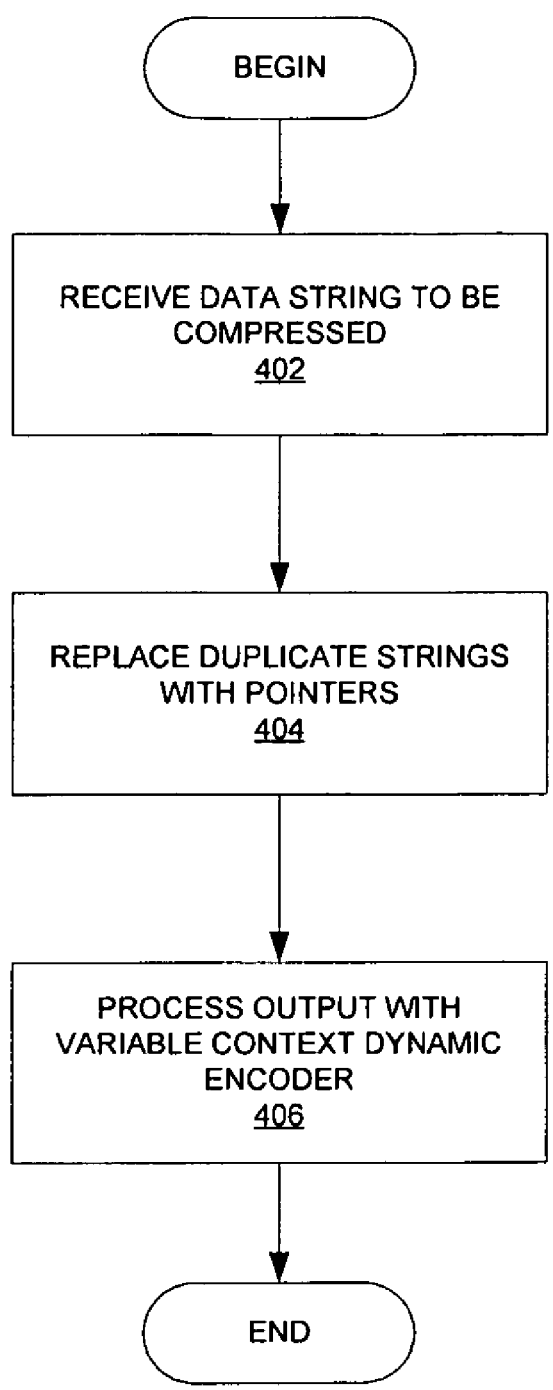
FIG. 4 is a flow diagram of one embodiment of a method for data compression.

FIG. 4 is a flow diagram of one embodiment of a method for data compression. At 402, one or more strings of data to be compressed are received. At 404, duplicate strings are replaced with pointers using a first compression algorithm. At 406, an output of the first compression algorithm is processed with a second compression algorithm using a variable context dynamic encoder. In one embodiment, the first compression algorithm includes a LZSS algorithm. In another embodiment, the first compression algorithm includes a LZ78 or LZW algorithm. Those of ordinary skills in the art will recognize that there exists other algorithms where duplicate strings are replaced with pointers.

In one embodiment, the second compression algorithm includes an adaptive Huffman encoder. The example described herein refer to an order-0 model. A higher-order model may produce a better compression ratio. Those of ordinary skills in the art will recognize that the present invention is not limited to order-0 model but other orders may be generated as well. In another embodiment, the second compression algorithm includes an adaptive range encoder.

Figure 5:
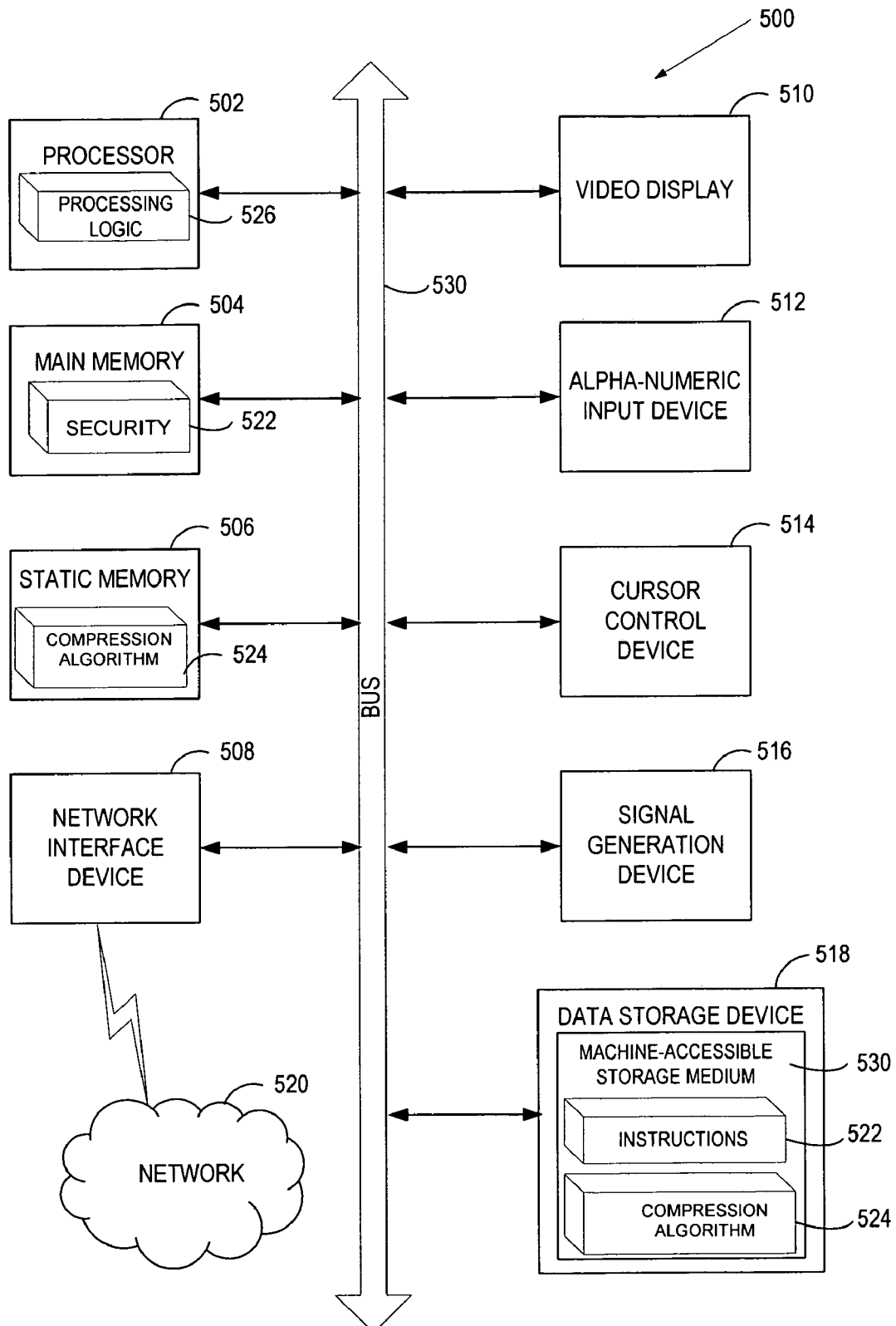
FIG. 5 is a block diagram of an exemplary computer system.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more general-purpose processing devices such as a microprocessor, central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 is configured to execute the processing logic 526 for performing the operations and steps discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The data storage device 518 may include a machine-accessible storage medium 530 on which is stored one or more sets of instructions (e.g., software 522) embodying any one or more of the methodologies or functions described herein. The software 522 may also reside, completely or at least partially, within the main memory 504 and/or within the processing device 502 during execution thereof by the computer system 500, the main memory 504 and the processing device 502 also constituting machine-accessible storage media. The software 522 may further be transmitted or received over a network 520 via the network interface device 508.

The machine-accessible storage medium 530 may also be used to store a compression algorithm 524 as presently described. The compression algorithm 524 may also be stored in other sections of computer system 500, such as static memory 506.

While the machine-accessible storage medium 530 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instructions for execution by the machine and that cause the machine to perform any one or more of the methodologies of the present invention. The term "machine-accessible storage medium" shall accordingly be taken to include, but not be limited to, solid-state memories, optical and magnetic media, and carrier wave signals.

Figure 6:
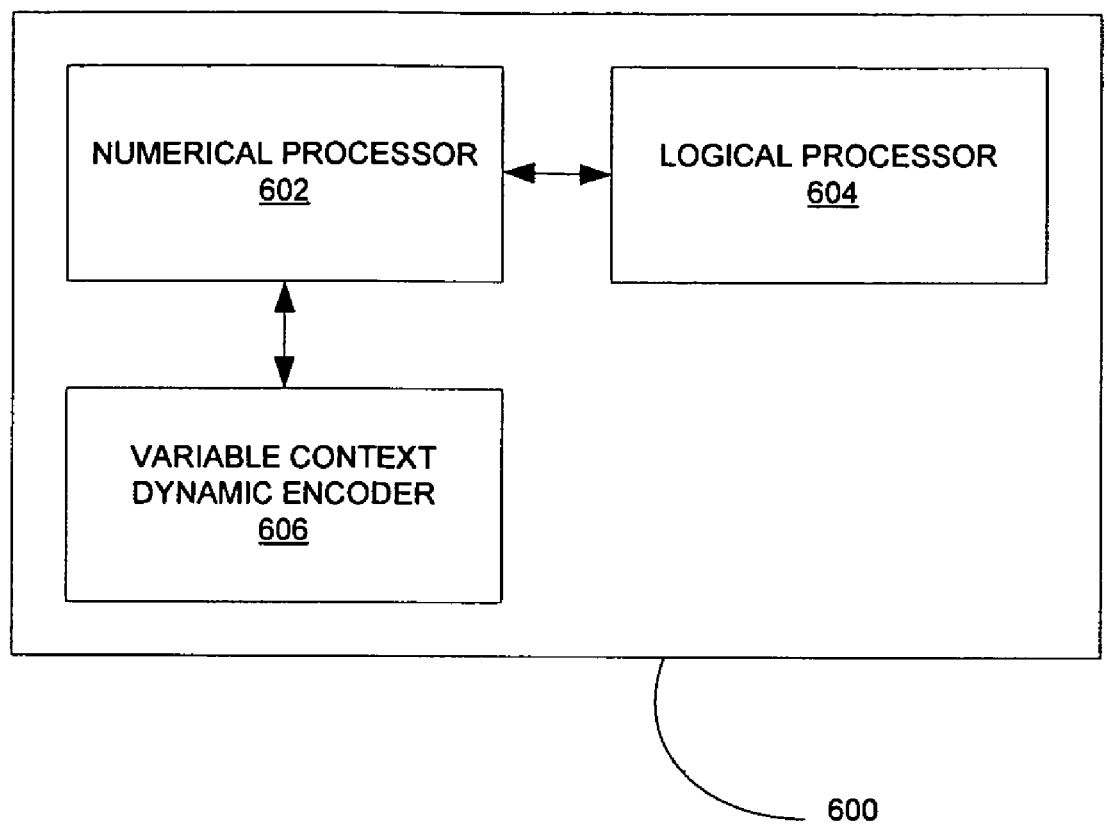
FIG. 6 is a block diagram of one embodiment of a apparatus for compressing data

FIG. 6 illustrates an apparatus 600 for compressing data. The apparatus 600 includes a numerical processor 602, a logical processor 604, and a variable context dynamic encoder 606. The numerical processor 602 receives one or more strings of data to be compressed. The logical processor 604 is coupled to the numerical processor and replaces duplicate strings with pointers using a first compression algorithm. The variable context dynamic encoder 606 is coupled to the logical processor and processes an output of the logical processor with a second compression algorithm. In one embodiment, the first compression algorithm includes a LZSS algorithm or a LZMA algorithm. In one embodiment, the second compression algorithm includes an adaptive Huffman encoder, or a range encoder.

In the above description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method comprising:
   receiving one or more strings of data to be compressed;
   replacing duplicate strings with pointers using a first compression algorithm; and
   processing an output of the first compression algorithm with a second compression algorithm using an adaptive encoder of a compressor without transmitting data statistics to a decoder having no initial data model of the strings of data.

2. The computer-implemented method of claim 1 wherein the first compression algorithm includes a LZSS algorithm.

3. The computer-implemented method of claim 1 wherein the first compression algorithm includes a LZ78 algorithm or a LZW algorithm.

4. The computer-implemented method of claim 1 wherein the second compression algorithm includes an adaptive Huffman encoder.

5. The computer-implemented method of claim 1 wherein the second compression algorithm includes an adaptive range encoder.

6. The computer-implemented method of claim 1 wherein the adaptive encoder includes an entropy encoder where the most common symbols use the shortest codes, and the least common symbols use the longest codes, with unused symbols having no codes.

7. A computer-readable storage medium, having instructions stored therein, which when executed, cause a computer system to perform a method comprising:
   receiving one or more strings of data to be compressed;
   replacing duplicate strings with pointers using a first compression algorithm; and
   processing an output of the first compression algorithm with a second compression algorithm using an adaptive encoder of a compressor without transmitting data statistics to a decoder having no initial data model of the strings of data.

8. The computer-readable storage medium of claim 7 wherein the first compression algorithm includes a LZSS algorithm.

9. The computer-readable storage medium of claim 7 wherein the first compression algorithm includes a LZ78 algorithm or a LZW algorithm.

10. The computer-readable storage medium of claim 7 wherein the second compression algorithm includes an adaptive Huffman encoder.

11. The computer-readable storage medium of claim 7 wherein the second compression algorithm includes an adaptive range encoder.

12. The computer-readable storage medium of claim 7 wherein the adaptive encoder includes an entropy encoder where the most common symbols use the shortest codes, and the least common symbols use the longest codes, with unused symbols having no codes.

13. A compressor comprising:
- a numerical processor for receiving one or more strings of data to be compressed;
- a logical processor coupled to the numerical processor, the logical processor for replacing duplicate strings with pointers using a first compression algorithm; and
- an adaptive encoder coupled to the logical processor, the adaptive encoder for processing an output of the logical processor with a second compression algorithm without the adaptive encoder transmitting data statistics to a decoder having no initial data model of the strings of data.

14. The compressor of claim 13 wherein the first compression algorithm includes a LZSS algorithm.

15. The compressor of claim 13 wherein the first compression algorithm includes a LZ78 algorithm or a LZW algorithm.

16. The compressor of claim 13 wherein the second compression algorithm includes an adaptive Huffman encoder.

17. The compressor of claim 13 wherein the second compression algorithm includes an adaptive range encoder.

18. The compressor of claim 13 wherein the adaptive encoder includes an entropy encoder where the most common symbols use the shortest codes, and the least common symbols use the longest codes, with unused symbols having no codes.

19. A computing system comprising:
- a processor to receive one or more strings of data to be compressed, to replace duplicate strings with pointers using a first compression algorithm, and to process an output of the first compression algorithm with a second compression algorithm using an adaptive encoder of a compressor without transmitting data statistics to a decoder having no initial data model of the strings of data.

20. The computing system of claim 19 wherein the adaptive encoder generates a tree of non-overlapping bit-sequences, the length of each sequence being inversely proportional of the likelihood of that symbol needing to be encoded, where unused symbols are not generated on the tree.

* * * * *